United States Patent [19]

Richman

[11] Patent Number: 4,742,427
[45] Date of Patent: May 3, 1988

[54] ELECTROSTATIC DISCHARGE SIMULATION

[75] Inventor: Peter L. Richman, Lexington, Mass.

[73] Assignee: KeyTek Instrument Corp., Wilmington, Mass.

[21] Appl. No.: 826,862

[22] Filed: Feb. 6, 1986

[51] Int. Cl.[4] ............... H05F 3/04; G01R 29/12
[52] U.S. Cl. ........................... 361/230; 324/457
[58] Field of Search ............ 361/230, 120; 324/72, 324/109, 457, 458, 122; 307/106, 108, 110

[56] References Cited

FOREIGN PATENT DOCUMENTS 892787 10/1953 Fed. Rep. of Germany ...... 361/230

OTHER PUBLICATIONS

High Voltage Measurement, Testing and Design, by Gallagher et al. p. 54, 1983, by John Wiley & Sons, Ltd.
ESD Testing; The Interface Between Simulator and Equipment Under Test; 1985, 6th EMC Symposium, Keytek Instrument Corp., Richman et al.
Radiation from a Pulse Discharge, pp. IID 515-517, Porter et al., Proceed. of 4th Internat'l. Conf. on Ionization.
Phenomena in Gases, N. R. Nilsson, vol. I, North-Holland Pub. Co., Amsterdam, 1960.
Nanosecond Current Pulse Former, pp. 1107-1109, M. G. Nikoforov, Instruments & Experimental Techniques, vol. 1, Jan./Feb. 1966, Plenum Pub. Corp., N.Y.
Qualitätsparameter, EMV, pp. 321-326, W. Liess, Radio Fernschen Elektronik, vol. 33, No. 5, May 1984, East Berlin, DDR.

Primary Examiner—L. T. Hix
Assistant Examiner—D. Rutledge
Attorney, Agent, or Firm—Schiller, Pandiscio & Kusmer

[57] ABSTRACT

Disclosed is an improved impulse circuit for delivering, from an electrical charge in a capacitor, an electrostatic spark discharge across an air gap to equipment under test. The circuit includes a gas gap in series combination between said air gap and the high energy side of the capacitor. Also included is a divider network, including resistors connected across the gaps so as to apportion voltages across the gaps upon application of the charge from the capacitor to the resistors so that initial electrical conduction through a first of the gaps leads to a spark discharge across the second gap, and the major flow of current from the capacitor passes first through the second gap and then through said already conducting first gap to produce said spark discharge across the first gap with current waveforms defined primarily by the firing characteristics of the second gap under conditions of overvoltage of the second gap.

21 Claims, 3 Drawing Sheets

ELECTROSTATIC DISCHARGE SIMULATION

This invention relates to electrostatic discharge (ESD) simulation, and more particularly to improved apparatus for simulating electrostatic discharge from the human body or mobile furnishings, for purposes of testing electronic equipment.

Electrostatic discharge is the name given to the phenomenon exemplified by the spark that, for example, leaps from an individual's finger to a doorknob on a dry day. A human body or a mobile furnishing such as a rolling chair or cart, can be charged to a potential of thousands of volts when such individual or furnishing typically moves across a carpet or a vinyl floor. Although human perception of a spark from the finger starts at 3 kV, values of the potential often reach 5 to 10 kV and can range as high as 20 or 25 kV. When the human hand or finger gets near a large object, including sensitive computers and other electronics containing metal at a different potential, the potential on the hand and body will usually discharge to the metal. The mechanism of the discharge through this gas breakdown, called a spark, can be defined an a transition from a non self-sustaining discharge across a gap (i.e., a Townsend or dark discharge) to a brief self-sustaining discharge or current-flow bridging the gap, usually occurring with explosive suddenness and characterized by a catastrophic and complete breakdown of the dielectric of the gas.

The effects of ESD can be extremely disruptive to operation of electronic circuits such as computers. Malfunction can result from direct current injection due to the discharge spark, from the electric or magnetic field that accompanies the ESD spark, or from related phenomena.

Much work has been done to understand the waveforms involved in ESD, particularly to assist in reducing the vulnerability of electronic equipment to typical ESD voltages so that the equipment will not fail when it is put into service. During the course of this work, it has become clear that ESD possesses and number of distinguishing characteristics.

ESD is statistical, i.e., successive discharges under apparently identical conditions can result in vastly different fields and current waves.

ESD current waveforms at lower voltages (e.g., 3 to 6 kV) will typically have far faster risetimes (often less than a nanosecond) than those at higher voltages (typically ranging from 5 to 20 nanoseconds). The steep rise times of ESD current waveforms, indeed their steep initial spikes, often can cause a electronic equipment failures at lower voltages, even though ESD's at higher voltages, with their typically slower risetimes, may cause far fewer failures.

Finally, the approach speed of the human hand (with or without an intervening metal object such as a ring, bracelet, tool or key), or a rolling chair or cart, towards the victim electronic equipment has a major effect on the rise time of the ESD current waveform; the faster the approach speed, the faster the rise time of the ESD waveform. Even at 10 to 15 kV, and occassionally at 20 to 25 kV, ESD rise times of less than a nanosecond or one or two nanoseconds can occur for very fast approach speeds, particularly at very low relative humidities.

All of these foregoing should also characterize electronic ESD simulators designed to replicate electrostatic discharge from the human body or mobile furnishings, for purposes of testing electronic equipment.

Since it is desirable to provide electronic equipment that will not malfunction in normal service, and since ESD is a normal hazard for most electronic equipment, there is a great deal of interest in accurate worst-case ESD simulation. The de facto test standard is discharge from a human hand with an intervening metal object, for this creates a higher arc current than discharge without such a metal object. The discharge current is similar to, although lower than that from metal mobile furnishings. For the same reason, since fast-approach ESD has more of a chance of causing equipment upset or damage, and since it can and will occur at least some of the time in actual situations, there is a widespread desire and need to simulate it accurately.

Unfortunately, even though the very fast approach speed required toi generate a nanosecond rise time at voltages even as high as 10 to 20 kV can occur in the real world, it is difficult to simulate in test situations. One of the problems in such situations is that many, many repetitive ESD's must be generated to determine worst-case ESD susceptibility points in the clock cycle and software routine of equipment under test. One major computer manufacturer, for example, makes 10,000 to 20,000 ESD tests at each possible susceptible location in its computers during the design phase of the latter. Repetition rates range as high as 10 to 60 ESD's per second during such tests; and there may be 20 to 50 such locations on the outside of such a computer. Performance of that many tests on a mechanically simulated, fast-approach basis appears to be quite impractical.

One approach that has been proposed to obtain both fast-approach rise times and waves that are more repeatable than the typical range of real air-discharge ESD's, is to substitute a switching operation inside the simulator for the actual air gap discharge. In this configuration, referred to for obvious reasons as direct current injection, the tip of the ESD simulator is held directly in contact with the equipment under test (i.e., no air gap) as a charged capacitor is "dumped" or connected to the tip by a high-speed internal switch. One problem with this approach is that such direct contact from an external simulator may not be possible to the circuit etch behind a keyboard. Also, switches that can furnish discharge current waves with nanosecond rise times are expensive, not readily available, and are often difficult to use. More important than any of the foregoing reasons, however, is the fact that direct current injection, even with super-fast rise times, can do only a portion of the ESD simulation job. The often highly-disruptive electric (E) and magnetic (H) fields associated with a fast air discharge are simply unavailable at the correct geometric location in a direct current injection test configuration. Thus, direct current injection probably cannot furnish a fully realistic ESD simulation.

In addition, relays capable of switching high voltages have limited repetition rates and limited lives.

It is postulated that a major reason for slowing of ESD rise times at higher voltages (over 3–4 kV), particularly at slow approach speeds, would seem to be formation of corona or partial discharge under high electric field conditions. This stripping of electrons from atoms in the air, in effect a plasma generation, requires energy. The latter is supplied from the high-voltage tip of the simulator at the initiation of the discharge, thereby slowing ascent of the spark current and its associated magnetic or H-field, and electric or E-field (really E-field collapse).

A principal object of the present invention is, therefore, to provide an air-discharge simulation system that can produce waveforms with one to two nanosecond fronts even as high as 20 kV, and with corresponding fast fields as well as current injection waves. Yet another object of the present invention is to provide an ESD simulator system that will permit high repetition rate testing with good repeatability.

A specific object of the present invention is to provide apparatus and method to make possible ESD simulation by air discharge, with high speed rise times for both injected current and associated fields, over the full range of voltages to 25 kV or even beyond, and under slow approach or even stationary simulator operating conditions.

Other objects of the present invention will be obvious and will in part appear hereinafter. The invention accordingly comprises the apparatus possessing the construction, combination of elements, and arrangement of parts, and the process including the several steps and the relation of one or more of such steps with respect to each of the others, all of which are exemplified in the following detailed disclosure and the scope of the application of which will be indicated in the claims.

For a fuller understanding of the nature and objects of the present invention, reference should be had to the following detailed description taken in connection with the accompanying drawings in which like numerals denote like parts, and wherein.

Figure 1:
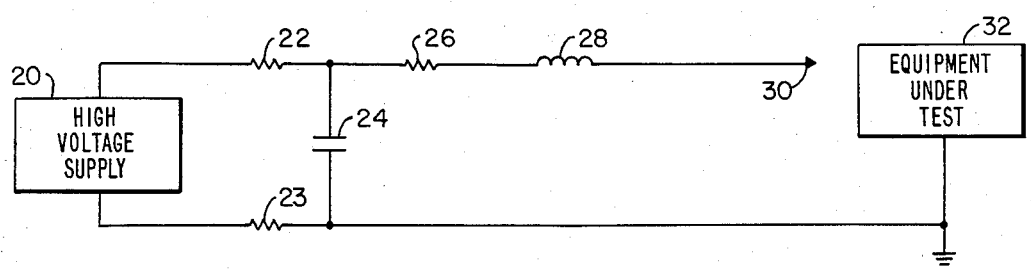
FIG. 1 is a schematic electronic block diagram of a prior art electrostatic discharge simulator.

The prior art form of an ESD simulator shown in FIG. 1, includes high voltage power supply 20, the high-voltage and ground terminals of which are respectively connected to one end of each of multi-megohm charging resistors 22 and 23. Capacitor 24, which simulates the human body (60 to 300 pf), and other stray capacitances is connected to the opposite ends of resistors 22 and 23 so as to be in parallel across the power supply. Connected in sequence to the junction of resistor 22 and capacitor 24, are series-coupled resistor 26 (representing the body's resistance—150 to 10,000 ohms, typically 500 to 1000) and inductor 28. The latter is omitted in some simulator circuits; but it is there, physically, in both the human body (0.3 to 0.9 uH) and most simulators (typically 0.5 to 2 uH). The other end of inductor 28 is connected to simulator tip 30, typically a pointed or rounded metal body. The other end of resistor 23 is connected to equipment 32 under test (hereinafter EUT), usually to the cabinet, green ground or a ground plane under the EUT.

Figure 2:
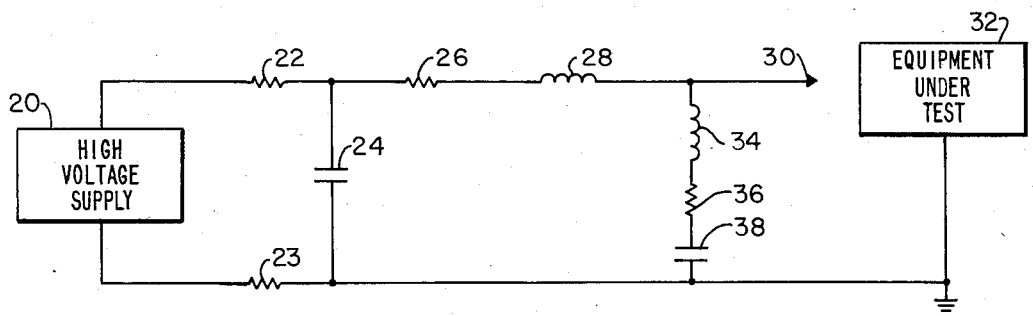
FIG. 2 is a schematic block diagram of yet another prior art electronic electrostatic discharge simulator.

The second prior art circuit shown in FIG. 2 includes an R-L-C path connected in parallel to capacitor 24 and formed of series connected inductor 34 (approximately 0.1 uH), resistor 36 (approximately 200 ohms) and capacitor 38 (approximately 10 pf). This R-L-C path is intended to represent the low-inductance capacity of the hand and forearm to free space. Use of this circuit, or its electronic equivalent in a simulator design, gives very fast rise times for the discharge from tip 30 to EUT 32. The circuit of FIG. 1 cannot provide such fast rise times because of the far higher inductance of the human body than that of the hand. The circuit of FIG. 2, however, typically generates such steep fronts for stored voltages only up to 3 to 6 kV. Corona still severely slows rise times (to 5 to 20 ns) at voltages of 10 to 20 kV, or even lower for high humidity situations.

One basic concept behind the present invention is the idea that overvoltage of the air gap between the simulator tip and the EUT produces conduction of the type achieved in a fast-approach ESD. Since initiation of corona in the air gap requires milliseconds, a fast approach can bring the simulator tip to less-than-critical spacing with respect to the equipment under test, before substantial onset of corona, thereby insuring air gap overvoltage at discharge initiation. This appears to be the way in which a fast approach results in fast rise time; there is little or no energy dissipated in plasma formation. At slow or normal approach at higher voltages, corona forms even faster, apparently explaining the fact that still faster approaches are needed at higher voltages to result in waveforms with shorter rise times.

Thus, a possible system for over-volting the air gap would be to keep the spacing between the simulator tip and the EUT fixed, elevate the voltage at the simulator's tip and then release a spring-loaded tip extension or solenoid-operated tip extension that, in one or two milliseconds or less, reduces the gap to ¾ or ⅔ of its original dimension. Thus the tip would go well past critical spacing for the simulator voltage and a discharge wave would be generated that would look like a fast-approach wave because the over-voltage would initiate discharge before corona could form.

Another, more practical system for implementing the present invention as embodied in the present invention, is to provide gas gap means external to the air gap for causing the desired over-volting of such gas gap means rather than the air gap. The preferred form of such gas gap means employs a series gas gap in conjunction with a resistive divider connected across the series combination of gaps, regardless of whether it is the air gap or the gas gap that one chooses to overvoltage. Such a divider causes one of the gaps to reach its firing potential before the other reaches its own firing potential. The first to fire dumps or discharges auxiliary capacitance or just stray capacitances and forms a conducting path, automatically over-volting the second which then fires with superfast, sub-nanosecond speed. As will be seen hereinafter in different implementations, either of the two gaps can be the ESD-simulator-to-EUT air gap.

Physical approach of the simulator to the EUT in this latter system may be slow or stationary. In slow approach the voltage may be fixed; in stationary position the voltage is preferably ramped. In either case a wave that looks like a fast-approach discharge current wave will result; again, because the second gap (whether the simulator-to-EUT air gap or an auxiliary gas gap) fires in an over-voltage mode without having time to build corona.

Figure 3:
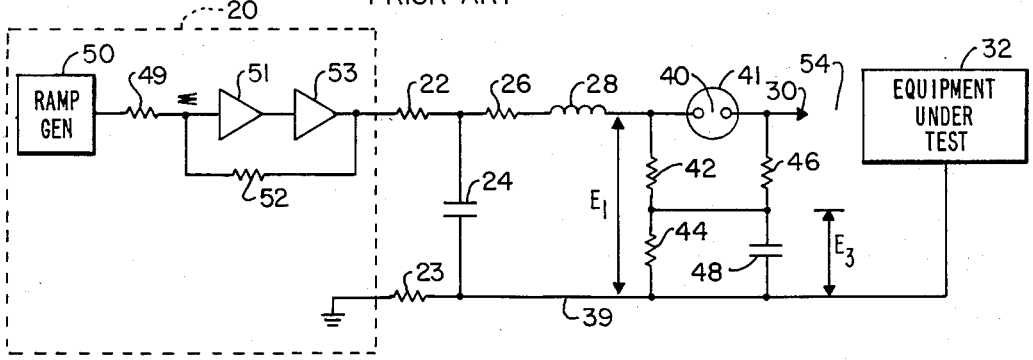
FIG. 3 is a schematic block diagram of a simple version of an ESD simulator incorporating the principles of the present invention.

FIG. 3 shows the circuit of one preferred version of the present invention, using the simple R-L-C configuration similar to FIG. 1 for the exemplary, basic simulator circuit. Thus the embodiment of FIG. 3 includes high voltage power supply 20, the high-voltage and ground terminals of which are respectively connected to one end of each of multimegohm charging resistors 22 and 23. Capacitor 24 is connected in parallel across the power supply and the charging resistors. Connected to the junction of resistor 22 and capacitor 24, is one end of resistor 26, the other end of the latter being connected to one end of inductor 28. The other end of resistor 23 is connected to return lead 39 connected to equipment 32 under test.

The embodiment of FIG. 3 also includes means defining gas gap 40, or a break-over device exemplified by gas-tube switch 41, connected between the other end of inductor 28 and simulator tip 30. It should be recognized that gap 40 can be a second air gap of fixed or adjustable dimensions. Thus, the term "gas gap" as used herein is intended to distinguish the additional gap from the ESD-simulator-to-EUT air gap, and should not be considered limited to any specific gas.

The embodiment of FIG. 3 also includes a resistive divider network formed of series-connected resistors 42 and 44 connected in parallel via series-connected resistor 26 and inductor 28; with capacitor 24, and series-connected resistor 46 and ancillary capacitor 48. The latter are connected between return lead 39 and the junction of tip 30 and gas-tube switch 41, the junction between capacitor 48 and resistor 46 being connected to the junction between resistors 42 and 44. The divider network serves to insure that gas gap 40 in switch 41 does not break down until the voltage applied to it is suddenly elevated to a level in excess of its nominal or critical breakdown rating (e.g. by an excess of 10-60%). Such structure, effectively prevents corona generation within gas gap 40 because the voltage across it rises so quickly. The circuit thereby insures a steep current discharge wavefront, and a correspondingly steep front on the associated magnetic (and electric) fields. As a practical matter, in some embodiments, resistor 46 can be entirely omitted and capacitor 48 can simply be a stray capacitance.

The simulator embodiment of FIG. 3 can be operated either in a conventional slow or normal approach to the EUT, or it can be stationary and the voltage on its internal simulation capacitors slowly increased. To this end, high voltage supply 20 can be formed to include ramp generator 50 (ca. 5 volt range), the output of which is connected through resistor 49 (typically one megohm) to the input summing junction of operational amplifier 51. The output of amplifier 51 is connected to the input of non-inverting high voltage amplifier 53. The output of amplifier 53 is connected in a feedback loop through resistor 52 (typically 5,000 megohms) to the summing junction at the input of amplifier 51. The power output from amplifier 53 then constitutes a ramped high voltage supply.

Circuit values should be chosen so that dielectric breakdown and consequent conduction of air gap 54 (between tip 30 and EUT 32) precedes conduction in gas gap 40, whether or not (1) a fixed voltage $E_1$ is maintained between the output of inductor 28 and return lead 39, and tip 30 is made to approach EUT 32, or (2) a fixed tip-to-EUT spacing is maintained, but voltage $E_1$ is slowly ramped upward. Such breakdown of air gap 54 is set to occur typically at $\frac{2}{3}$ of the $E_1$ selected for the particular test. $E_1$ typically may be 15 kV, for example. Once air gap 54 fires (with ancillary capacitor 48 or the stray capacitance supplying the small initial air-gap conduction current, e.g. several amperes), the voltage on gas gap 40 rapidly rises to the full $E_1$ value since the voltage across air gap 54 goes to essentially zero as the latter conducts. If gas gap breakdown voltage $E_2$ has been properly selected as $\frac{2}{3}$ of $E_1$, for example, gas gap 40 will now see a 50% over-voltage from capacitors 24 and 48 and discharge the latter with a steep leading edge on the discharge current. The rapid over-volting of gas gap 40 before corona can begin, causes rapid arc formation without energy loss to plasma, insuring a fast current rise time. Since in this configuration the air gap is already conducting before the series gas gap is over-volted and turns on, the turn-on characteristics of air gap 54 do not control discharge current rise time. Thus, this embodiment applies a simulated ESD to the EUT with steep leading edge on both airborne discharge current and on its associated magnetic field, together with simulation of steep-edged electric field collapse.

For proper operation of the circuit of FIG. 3, the desired energy level or initial stored voltage $E_1$ on capacitor 24 (or the voltage $E_1$ to which it will be ramped in a stationary tip mode) is selected, for example to be 15 kV. The desired over-voltage percentage can then be selected for gas-gap 40, usually between 10% and 60% (possibly as high as 100% or 200%), but in any event enough to insure gas-gap breakdown well before substantial initiation of internal corona. The value for resistor 44 is selected to be high enough to insure that it will not influence discharge energy; 1 megohm will usually work, as will 50,000 megohms. The value for resistor 42 is set at the percent of the value of resistor 44 equal to the desired gas gap over-voltage. Thus to achieve a 50% overvoltage at gap 40, the resistance for resistor 42 should be established as 50% of the resistive value for resistor 44. The value of capacitor 48 should be selected to be to a fraction of the capacitance of capacitor 24, but large enough to insure that the discharge energy from capacitor 48 (charged to $E_1 \times (R_{44}/(R_{42}+R_{44}))$) where $R_{42}$ and $R_{44}$ are the resistive values of resistors 42 and 44 respectively), is sufficient to ionize fully the air in gap 54. Since the capacitance of capacitor 24 will typically be between 100 and 150 pf, the capacitance of capacitor 48 should lie below 50 pf. In many cases, the 3 to 10 pf "stray" capacitance of tip 30 to free space or nearby grounded metal will be sufficient.

Auxiliary discharge resistor 46, associated with capacitor 48, should be selected to insure that enough current will flow in air gap 54 after ionization, yet will not dominate the principal discharge that will follow from capacitor 24 through resistor 26 and gas gap 40. Typically then, the values for resistor 46 should lie between the value of resistor 26 and many times the latter value. If $R_{26}$ is 500 ohms, for example, $R_{46}$ can be 500 to 5000 ohms in a typical implementation; but also can be as high as 1 or more megohms or as low as zero, depending on circuit conditions and design considerations.

Breakover voltage $E_2$ of gas-tube switch 41 should be on the order of $E_1 \times (R_{44}/(R_{44}+R_{42}))$ to insure that it will not break over of its own accord with $E_1 \times (R_{42}/(R_{44}+R_{42}))$ across it, and to insure that gas gap 40 is properly over-volted.

In one embodiment, one resistor across a first gap can be infinite and the one across the second gap low (i.e., from several hundred kilohms to 500 or 1000 megohms). In such case, if the second gap is the ESD simulator-to-EUT air gap, the system will work only for stationary applications and hence is not preferred.

Operation of the embodiment of FIG. 3 can advantageously be described in connection with exemplary values selected for its components. For example, for 15 kV as the desired $E_1$, the value for resistor 44 is chosen to be 5,000 megohms. For a 50% overvoltage, the value for resistor 42 would then be 2,500 megohms. Values for capacitor 24, capacitor 48, resistor 26 and resistor 46 are 100 pf, 25 pf, 500 ohms and 10 ohms respectively.

Figure 4:
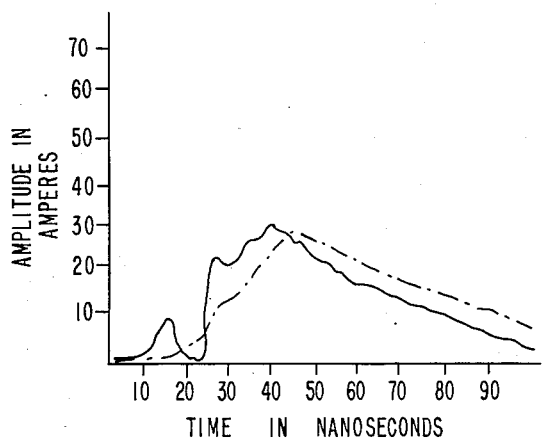
FIG. 4 are exemplary waveforms of a discharge pattern from an ESD simulator of the prior art and from an embodiment of the type shown in FIG. 3.

When the high voltage for supply 20 is set at 15 kV, tip 30 is brought slowly toward the EUT. Alternatively, with tip-to-EUT spacing or gap 54 set at a distance corresponding with 10 kV air breakdown, $E_1$ is slowly (e.g. 1 sec. or less) ramped upwards. The voltage, $E_3$, across capacitor 48 is $\frac{2}{3} E_1$ or 10 kV. When gap 54 is at the critical value for 10 kV (for different electrode and EUT geometries, the critical distance will lie between 1/6 and ½ inch typically), under standard conditions of temperature and pressure, capacitor 48 will start to discharge through air gap 54. The voltage across air gap 54 will drop in 5 to 50 nanoseconds to tens of volts, while a small, slow current spike typically of 5 to 10 amperes from capacitor 48 and resistor 46 flows through and thoroughly ionizes the dielectic in gap 54. Gap 40 now sees 15 kV minus the now essentially-zero air gap voltage. Since switch 41 preferably is only a 10 kV breakover device it fires with great speed at this 50% over-voltage, thereby injecting a second current pulse into already-ionized air gap 54, but with a super-fast rise time and high amplitude. Thus, as shown in the continuous line trace of a waveform in FIG. 4, EUT sees two input pulses, a first pulse of relatively low magnitude and slow rise time, and for example 15 nanoseconds later, a second pulse of very large relative magnitude and super-fast rise time (e.g. from less than a nanosecond to 1.5 to 2 nanoseconds). This waveform will be seen to differ substantially from the waveform of the current discharge found in prior art ESD simulators as shown in broken line in FIG. 4 and characterized by a relatively slowly rising wavefront.

Thus, the strategy is to apply a steeply-rising (on the order of one nanosecond) current edge during the main discharge of capacitor 24, by over-volting not air gap 54 itself, but companion gas gap 40 in this novel implementation. In a sense, the system is thus an advanced form of direct current injection, in which the current flows in the air-discharge arc, thereby generating what cannot be generated during other forms of direct current injection: the same fast-rising magnetic field (because of the physical arc current) that would be generated by a real-life fast-approach from a human hand with metal object.

Super-fast gas gaps are not available at all voltages for direct current injection systems of the prior art. With however, the configuration of the present invention, a not-inconsequential feature is that over-volting can provide breakover in the 1 nanosecond range for a gap that would otherwise exhibit 5 to 20 nanosecond breakover, while obtaining at the correct geometric location a steeply-rising H-field associated with the steep-edged arc current.

As described, in one application the tip is held stationary at about the desired (in the example given, 10 kV) critical distance. In this case, when the high voltage ramping slowly upwards reaches 15 kV in the example, fast-edge current injection into the arc will be initiated as described. Thus, the simulator can be left in one location and high repetition-rate testing accomplished with fast-approach rise times.

Another form of the instant invention results from using the simulator of FIG. 2 as the basic simulator equivalent circuit. In such case, the embodiment shown in FIG. 5 includes high voltage power supply 20, the high-voltage and ground terminals of which are respectively connected to one end of each of multimegohm charging resistors 22 and 23. Capacitor 24 is connected in parallel across the power supply and the charging resistors. Connected to the junction of resistor 22 and capacitor 24, is one end of resistor 26, the other end of the latter being connected to one end of inductor 28. The other end of resistor 23 is connected to return lead 39 connected to EUT 32. Connected in parallel with capacitor 24 via series-connected resistor 26 and inductor 28 is a separate, R-L-C path formed of series-connected inductor 34, resistor 36 and capacitor 38. Capacitor 38 may be either a physical capacitor or, preferably, the capacitance of a metal object (small plate, tube, etc.) to free space. Also included in FIG. 5 are means defining gas gap 40, or a break-over device exemplified by gas-tube switch 41, connected between the other end of inductor 28 and simulator tip 30.

Figure 5:
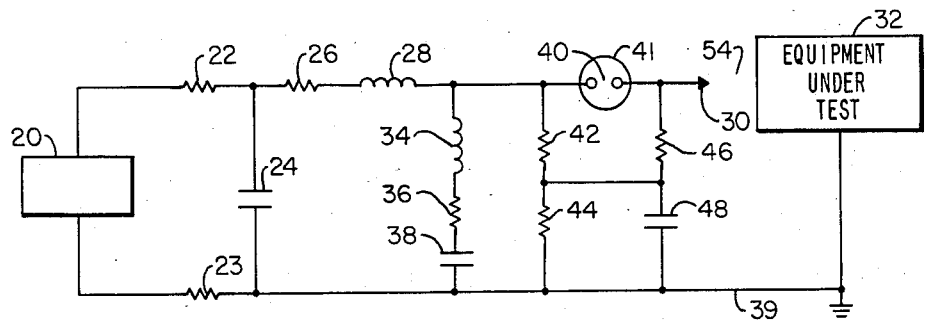
FIG. 5 is a schematic block diagram of yet another version of an ESD simulator incorporating the principles of the present invention.

As in FIG. 3, the embodiment of FIG. 5 comprises a resistive divider network including series-connected resistors 42 and 44 connected in parallel with capacitor 24. The divider network also includes series-connected resistor 46 and ancillary capacitor 48 connected between return lead 39 and the junction of tip 30 and gas-tube switch 41. Resistor 46 may actually be near or at zero, and capacitor 48 may be the "stray" or the capacitance of tip 30 to free space. The junction between capacitor 48 and resistor 46 is connected to the junction between resistors 42 and 44. Thus, the embodiment of FIG. 5 is an advanced version of FIG. 3 in that it more closely simulates the hand-and-forearm low inductance capacity to free space. The operation, however, of the embodiment of FIG. 5 is quite similar to that hereinbefore described with respect to FIG. 3.

Figure 6:
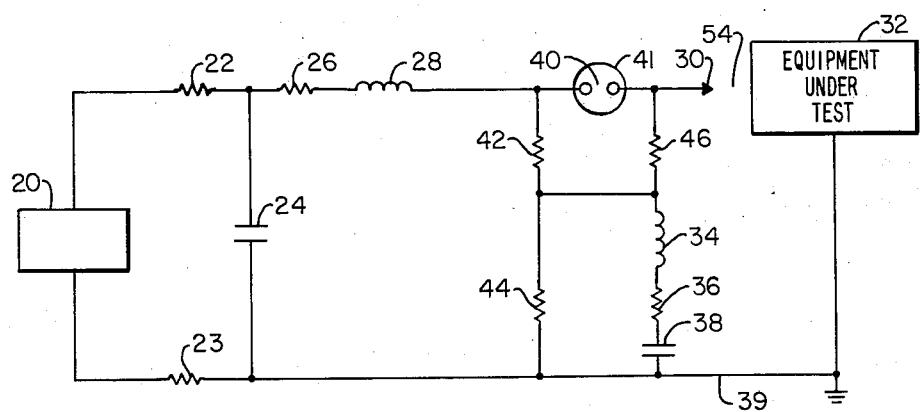
FIG. 6 is a schematic block diagram of an advanced and preferred version of the present invention.

Yet another version of the present invention, is shown in FIG. 6, in which capacitor 48 of FIG. 5 is replaced with the "hand/forearm" path (series-connected inductor 34, resistor 36 and capacitor 38 of FIG. 2) connected after gas-tube switch 41; i.e., switch 41 is interposed between the "body" RLC and the "hand" RLC. In the circuit of FIG. 6, resistor 46 is unimportant in comparison with the other components and can indeed be replaced by a short circuit.

Figure 7:
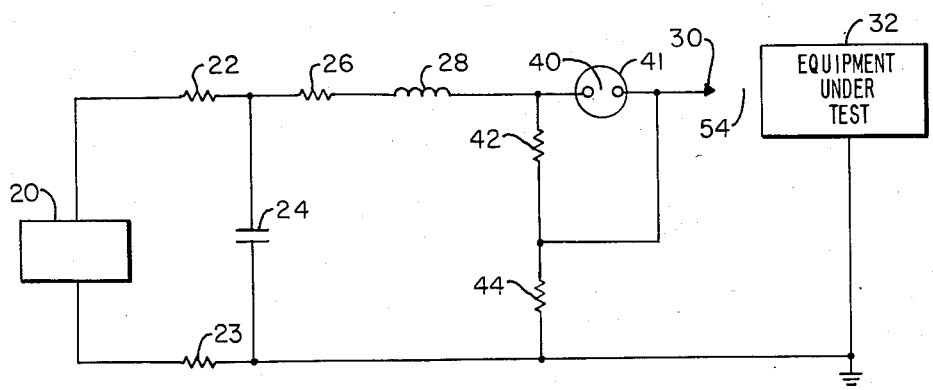
FIG. 7 is a preferred version of the embodiment of FIG. 6.

In the preferred implementation of FIG. 6, as shown in FIG. 7, the hand/forearm path thus defined can be provided instead simply as the stray (or capacitance to free space) of a metal object such as a small plate or tube, or indeed of discharge tip 30 itself. In such case, the R-L-C path formed by components 34, 36 and 38 has been replaced simply by that "stray" capacitance, and resistor 46 has been replaced with a short circuit between the output of gas gap 40 and the junction of resistor 42 and 44. Thus, resistor 42 is across gas gap 40 and resistor 44 connects the output side of the gas gap to system ground. In the preferred embodiment of FIG. 7, the ratio of the values of resistor 42 to resistor 44 is about 1:2 so typically resistor 42 is about 2500 megohms and resistor 44 is 5000 megohms. For the largest air gap spacing, the parameters of the circuit should be selected so that the gas breakdown potential of the gas gap is between about $\frac{1}{4}$ E$_1$ and E$_1$, (preferably $\frac{2}{3}$ E$_1$) where E$_1$ is the desired potential to which capacitor 24 will be charged by high voltage supply 20.

Yet other useful forms of the present invention are designed to insure that the first gap to fire is auxiliary gas gap 40 and not simulator-to-EUT air gap 54. In these cases a stationary position for the simulator (and of course the EUT) is necessary, or else over-volting of air gap 54 will not occur at all at correct voltage ratios. The voltage E$_1$ is not held constant, but is preferably ramped at any convenient rate. Two forms of this implementation are shown in FIGS. 8 and 9 respectively.

Figure 8:
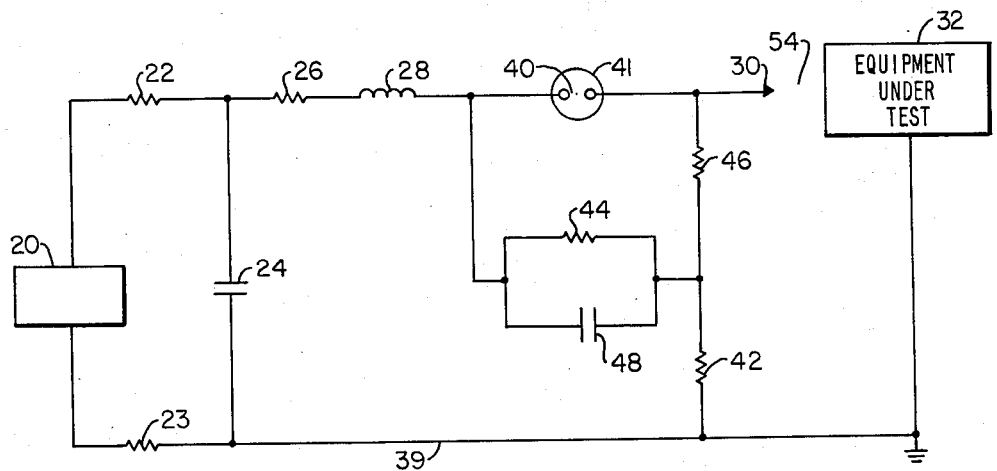
FIG. 8 is a schematic block diagram of yet another form of implementation of the present invention.

In FIG. 8, resistor 44 is disposed in parallel with capacitor 48, but the two are interchanged with resistor 42 of the circuit of FIG. 3. In forms similar to those shown in FIGS. 4 and 5, two additional circuits can be made as variations of the circuit of FIG. 3, again simply by the network interchange. Such versions are not specifically shown here as being redundant.

Figure 9:
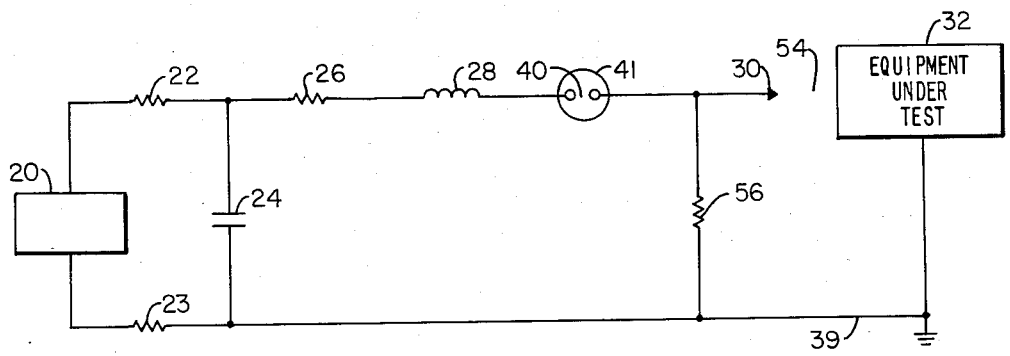
FIG. 9 is a schematic block diagram of another form of implementation of the present invention.

In FIG. 9, the extreme form of balance between resistors 42 and 44 (e.g. of FIG. 3) is taken for this gas-gap-fires-first implementation. The resistive divider here is exemplified by but single resistor 56, connected between return lead 39 and tip 30. In effect, resistor 56 in this configuration is equivalent to the divider of FIG. 3 in which resistor 44 is infinite and resistor 42 is low, from a few hundred kilohms to 500 or 1000 megohms as a practical matter. Since low-value resistor 56 is across air gap 54, the voltage across gap 54 is essentially zero before switch 41 fires, at which time air gap 54 receives the full E$_1$ as overvoltage.

Since certain changes may be made in the above apparatus and methods without departing from the scope of the invention herein involved, it is intended that all matter contained in the above description or shown in the accompanying drawing shall be interpreted in an illustrative and not in a limiting sense.

What is claimed is:

1. In an impulse circuit for delivering, from an electrical charge in charge storage capacitance means, an electrostatic spark discharge across an air gap to equipment under test, the improvement comprising:
    a gas gap in series combination between said air gap and the high energy side of said capacitance means; and
    a divider network, including a resistive impedance connected across at least one of said gaps for apportioning voltages across said gaps upon application of said charge to said combination, so that initial electrical conduction through a first of said gaps leads to a spark discharge across the other of said gaps, and the major flow of current from said capacitance means thus passes first through said other gap and then through said already conducting first gap to produce said spark discharge across said first gap with current waveforms defined primarily by the firing characteristics of said other gap under conditions of overvoltage of said other gap.

2. The improvement as defined in claim 1 wherein said divider network is arranged for apportioning said voltages across said gaps so that upon ionization of the gaseous dielectric in said first gap, current from said capacitance means primarily flows first through said other gap and then through the ionized medium in said first gap to produce said spark discharge across said first gap.

3. The improvement as defined in claim 1 including second capacitive means for providing current to initiate said initial electrical conduction in said first gap.

4. The improvement as defined in claim 3 wherein said second capacitive means is included in said divider network.

5. The improvement as defined in claim 3 wherein said second capacitive means includes stray capacitance associated with said network.

6. The improvement as defined in claim 1 wherein said other gap is said gas gap.

7. The improvement as defined in claim 1 wherein said gap gap is across a gaseous medium confined in an envelope.

8. The improvement as defined in claim 1 wherein said other gap is said air gap.

9. The improvement as defined in claim 1 including means for speeding the firing of said other gap.

10. The improvement as defined in claim 9 wherein said means for speeding the firing of said second gap comprises means for overvolting said second gap repsonsively to said initial conduction occuring through said first gap.

11. The improvement as defined in claim 3 including a high voltage supply connected for charging said charge storage capacitance means.

12. The improvement as defined in claim 11 wherein said high voltage supply includes means for ramping across a range of amplitudes, the output voltage from said high voltage supply.

13. The improvement as defined in claim 11 wherein
    said divider network is formed of a first resistor connected across said gas gap and a second resistor connected across said air gap, said second capacitive means being provided substantially only by the stray capacitance associated with said network and said tip;
    the ratio of the values of said first resistor to said second resistor is about 1:2; and
    the parameters of said impulse circuit are selected so that the gas breakdown potential of said gas gap is between about $\frac{1}{4}$ E$_1$ and E$_1$, where E$_1$ is the desired potential to which said charge storage capacitance means will be charged by said high voltage supply.

14. The improvement as defined in claim 13 wherein the parameters of said impulse circuit are selected so that the gas breakdown potential of said gas gap is about $\frac{2}{3}$ E$_1$.

15. The improvement as defined in claim 1 wherein said divider network includes an R-L-C network simulating the low inductance capacity of a human body to free space.

16. The improvement as defined in claim 1 wherein said divider network includes an R-L-C network simulating the low inductance capacity of hand and forearm of a human body to free space.

17. The improvement as defined in claim 1 wherein said divider network includes a first R-L-C network simulating the low inductance capacity of a human body and a second R-L-C network simulating the low inductance capacity of hand and forearm of a human body to free space.

18. The improvement as defined in claim 3 wherein said divider network is formed of only two resistors, a first of which is connected across said gas gap and a second of which is connected across said air gap, and said second capacitive means is provided substantially only by the stray capacitance associated with said network and said tip.

19. Method of delivering, from an electrical charge in charge storage capacitance means, an electrostatic spark discharge across an air gap from a discharge tip to equipment under test, said method comprising the steps of:

disposing a gas gap in series with said air gap;

charging said capacitance means with a first charge that is at a substantial overvoltage for at least a first of said gaps;

passing a relatively small second charge through a second of said gaps to cause the latter to conduct so as to cause said first gap to be overvolted by and therefore conduct current from said first charge, said current then flowing through the already conducting second gap to produce said spark discharge across said second gap with current waveforms defined primarily by the firing characteristics of said first gap.

20. Method of delivering an electrostatic spark discharge as defined in claim 19 including the steps of holding the voltage of said charge substantially constant while reducing the size of said air gap by moving said tip toward said equipment.

21. Method of delivering an electrostatic spark discharge as defined in claim 19 including the steps of maintaining the size of said air gap substantially constant while varying the voltage of said charge.

* * * * *

UNITED STATES PATENT AND TRADEMARK OFFICE
CERTIFICATE OF CORRECTION

PATENT NO. : 4,742,427
DATED : May 3, 1988
INVENTOR(S) : Peter L. Richman

It is certified that error appears in the above-identified patent and that said Letters Patent is hereby corrected as shown below:

Claim 7, column 10, line 16, delete "gap" (first occurrence) and substitute therefor -- gas --.

Signed and Sealed this

Sixth Day of September, 1988

*Attest:*

DONALD J. QUIGG

*Attesting Officer*    *Commissioner of Patents and Trademarks*